US006383924B1

(12) United States Patent
Farrar et al.

(10) Patent No.: US 6,383,924 B1
(45) Date of Patent: May 7, 2002

(54) METHOD OF FORMING BURIED CONDUCTOR PATTERNS BY SURFACE TRANSFORMATION OF EMPTY SPACES IN SOLID STATE MATERIALS

(75) Inventors: Paul A. Farrar, South Burlington, VT (US); Joseph Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/734,547

(22) Filed: Dec. 13, 2000

(51) Int. Cl.[7] .............................................. H01L 21/44
(52) U.S. Cl. ..................... 438/667; 438/589; 438/620; 438/977; 438/967; 438/705; 438/795
(58) Field of Search ................................. 438/589, 967, 438/620, 667, 977, 705, 795

(56) References Cited

U.S. PATENT DOCUMENTS

| 5,920,121 A | 7/1999 | Forbes et al. |
| 5,963,838 A | * 10/1999 | Yamamoto et al. ......... 438/766 |
| 6,100,176 A | 8/2000 | Forbes et al. |
| 6,121,126 A | 9/2000 | Ahn et al. |

OTHER PUBLICATIONS

Sato et al., "A New Substrate Engineering for the Formation of Empty–Space in Silicon (ESS) Induced by Silicon Surface Migration," 1999 IEEE, pp 517–520.*

F.A. Nichols, et al.—"Surface– (Interface–) and Volume–Diffusion Contributions to Morphological Changes Driven by Capillarity," Transactions of the Metallurgical Society of AIME, vol. 233, Oct. 1965, pp. 1840–1848.

Tsutomu Sato, et al.—"A New Substrate Engineering for the Formation of Empty Space in Silicon (ESS) Induced by Silicon Surface Migration," 1999 IEEE, pp. 517–520.

U.S. Application, Serial No. 09/069,346 filed Apr. 29, 1998, Attorney docket #303.367US1, pp. 1–22 w/6 shts. drwgs.

* cited by examiner

*Primary Examiner*—John F. Niebling
*Assistant Examiner*—David A. Zarneke
(74) *Attorney, Agent, or Firm*—Dickstein Shapiro Morin & Oshinsky LLP

(57) ABSTRACT

A plurality of buried conductors and/or buried plate patterns formed within a monocrystalline substrate is disclosed. A plurality of empty-spaced buried patterns are formed by drilling holes in the monocrystalline substrate and annealing the monocrystalline substrate to form empty-spaced patterns of various geometries. The empty-spaced patterns are then connected through vias with surfaces of the monocrystalline substrate. The empty-spaced patterns and their respective vias are subsequently filled with conductive materials.

45 Claims, 9 Drawing Sheets

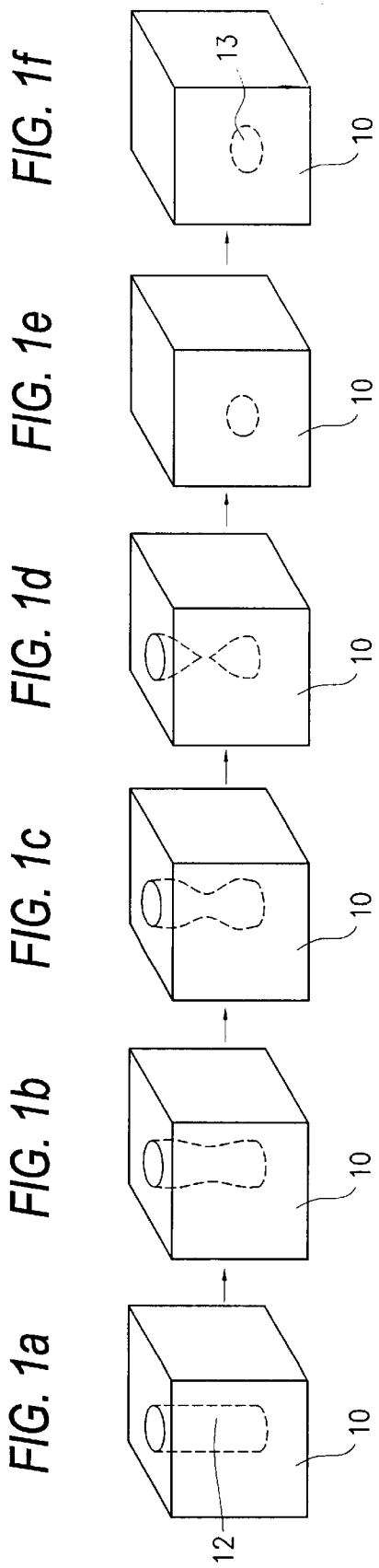

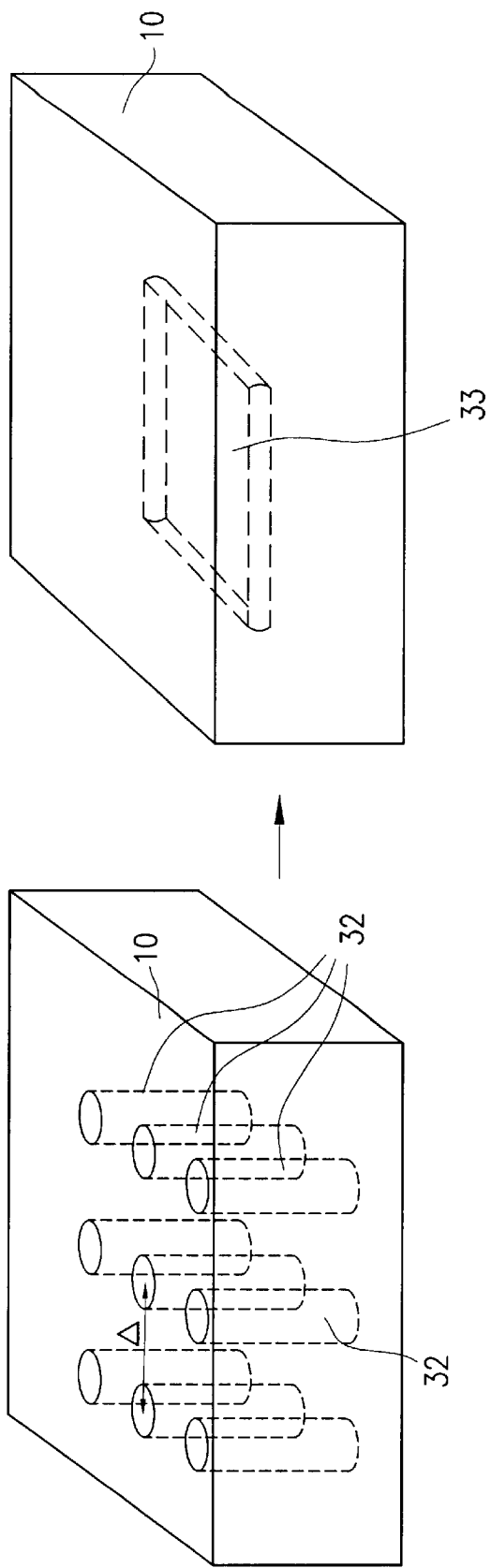

METHOD OF FORMING BURIED CONDUCTOR PATTERNS BY SURFACE TRANSFORMATION OF EMPTY SPACES IN SOLID STATE MATERIALS

FIELD OF THE INVENTION

The present invention relates to semiconductor devices and methods of making such devices. More particularly, the invention relates to solid state materials and to a novel method of forming buried conductor patterns in such solid state materials.

BACKGROUND OF THE INVENTION

Monocrystalline solid state materials such as single-crystal semiconductors are the basis of the current microelectronics industry. Solid state materials are characterized by a variety of properties, for example, electrical properties such as electrical conductivity or charge mobility, optical properties such as refractive index or speed of photons, thermal properties such as thermal conductivity or thermal expansion, mechanical properties such as stress or strain curves, and chemical properties such as resistance to corrosion or reaction consistency, among others.

Over the past years, the semiconductor industry has constantly explored new ways of increasing the amount of active surface area on the integrated circuit chips, particularly on those employing monocrystalline semiconductor substrates. Accordingly, attempts to modify the electrical, optical, thermal and/or mechanical properties of such monocrystalline substrates have been made in an effort to minimize the dimensions of the IC devices, while maximizing the corresponding available active area. For example, new epitaxial growth processes such as the Epitaxial Lateral Overgrowth (ELO) have been used in an attempt to extend the amount of surface area available to active devices. However, these growth processes had limited results mainly because they consume part of the precious surface areas for seeding purposes, defeating therefore the primary purpose of increasing the available active area.

Another technology proposed by the semiconductor industry is the so-called Silicon-On-Insulator (SOI) process, wherein oxygen atoms are implanted at high dose and energy to form a silicon dioxide insulating layer between the upper surface of the original monocrystalline substrate and the bottom bulk portion of the same substrate. Although the SOI devices have many advantages, such as reduced parasitic capacitance due to the buried insulating layer, the process is relatively expensive because of the high costs of implanting the oxygen atoms and curing of the implant-induced defects.

Accordingly, there is a need for an improved method of increasing the available active surface area on integrated circuit chips fabricated on monocrystalline substrates. There is also a need for a more advantageous method of forming monocrystalline superconducting substrates for low power and high speed microelectronics devices, as well as a method for minimizing the cost of fabricating such substrates. There is further a need for an improved metallization scheme which facilitates the formation of active devices on SOI substrates and on the more novel Silicon-On-Nothing (SON) substrates.

SUMMARY OF THE INVENTION

The present invention provides a method of forming a plurality of buried conductors and/or buried plate patterns in semiconductor substrates, such as monocrystalline silicon substrates. According to an exemplary embodiment of the invention, a plurality of empty-spaced buried patterns are formed in a monocrystalline substrate. Holes are next formed in the monocrystalline substrate to connect surfaces of the substrate with the previously formed empty-spaced patterns. The whole assembly is subsequently exposed to an oxidizing atmosphere so that the inner surfaces of the empty-spaced patterns are oxidized. The empty-spaced patterns are then filled with a suitable conducting material by suitable methods.

These and other features and advantages of the invention will be more clearly apparent from the following detailed description which is provided in connection with accompanying drawings and which illustrates exemplary embodiments of the invention.

BRIEF DESCRIPTION OF THE DRAWINGS

FIGS. 1(a)–9(f) illustrate a portion of a silicon substrate undertaking a sequence of steps for single sphere-shaped empty space formation.

FIGS. 2(a)–9(c) illustrate a portion of a silicon substrate undertaking a sequence of steps for single pipe-shaped empty space formation, performed in accordance with a method of forming a buried pattern of the present invention.

FIGS. 3(a)–9(b) illustrate a portion of a silicon substrate undertaking a sequence of steps for plate-shaped empty space formation, performed in accordance with a method of forming a buried pattern of the present invention.

FIG. 4 is a cross-sectional view of the representative silicon structure of FIG. 2(a), taken along line 4–4', at an intermediate stage of processing and in accordance with a first embodiment of the present invention.

FIG. 5 is a cross-sectional view of the representative silicon structure according to the present invention at a stage of processing subsequent to that shown in FIG. 4.

FIG. 6 is a cross-sectional view of the representative silicon structure according to the present invention at a stage of processing subsequent to that shown in FIG. 5.

FIG. 7 is a cross-sectional view of the representative silicon structure according to the present invention at a stage of processing subsequent to that shown in FIG. 6.

FIG. 8 is a cross-sectional view of the representative silicon structure according to a second embodiment of the present invention at a stage of processing subsequent to that shown in FIG. 6.

FIG. 9 is a cross-sectional view of the representative silicon structure according to the present invention at a stage of processing subsequent to that shown in FIG. 7.

DETAILED DESCRIPTION OF THE EMBODIMENTS

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is defined by the appended claims.

The term "substrate" used in the following description includes any semiconductor-based structure having an exposed surface in which the structure of this invention may be formed. The term "substrate" is to be understood as including substrates formed of silicon, silicon-on-insulator, doped and undoped semiconductors, epitaxial layers of silicon supported by a base semiconductor foundation, and other semiconductor and dielectric structures. Furthermore, when reference is made to a substrate in the following description, previous process steps may have been utilized to form regions or junctions in the base semiconductor structure or foundation.

The following illustration is for a particular embodiment in a silicon structure. However, it should be apparent to one skilled in the art that a similar embodiment is possible in any semiconductor structure.

Figure 2C:
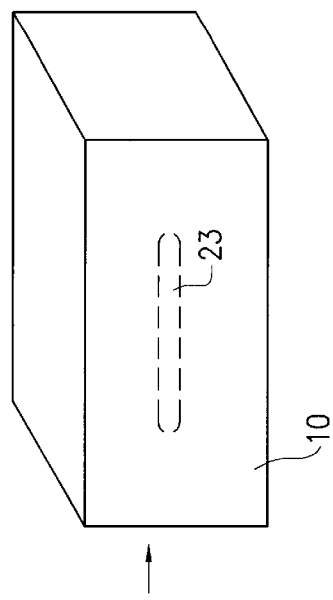
Figure 2B:
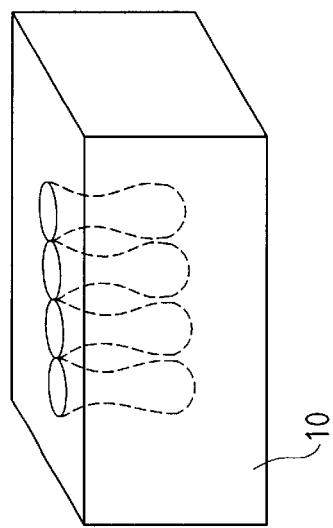

Referring now to the drawings, where like elements are designated by like reference numerals, FIGS. 4–14 illustrate exemplary embodiments of a buried silicon structure 100 comprising buried conductor patterns formed in accordance with the present invention. FIGS. 1–3 illustrate the formation of empty-spaced patterns in a silicon substrate 10, on which the buried conductor patterns of the present invention will be formed. Techniques for the formation of empty-spaced patterns of different geometries are described by Sato et al., in Substrate Engineering for the Formation of Empty Space in Silicon (ESS) Induced by Silicon Surface Migration, 1999 IEDM Digest, Paper 20.6.1, the disclosure of which is incorporated by reference herein.

Empty spaces which are formed in silicon substrates and have various shapes, such as plates, spheres or pipes, may be formed as a result of the self-organizing migration properties on the silicon surface. As such, when deeply-etched silicon substrates are annealed in a hydrogen ambient, for example, the silicon atoms on the surface migrate so that their surface energy is minimized. Based on these findings, Sato et al. have demonstrated that the geometry of empty spaces, such as spheres, plates and pipes, formed under the surface of a silicon substrate depends on the size, number and spacing of a plurality of cylindrical holes that are initially formed at a low temperature.

For example, FIGS. 1(a)–9(f) illustrate how a single sphere-shaped empty space 13 is formed from a single cylindrical hole 12 formed within the silicon substrate 10. Subsequent to the formation of the cylindrical hole 12, the silicon substrate 10 is annealed at a temperature lower than the melting point of monocrystalline silicon (1400° C.), for example, at a temperature of about 1100° C. Sato et al. have demonstrated that, within about 60 seconds and under a reducing ambient of 10 Torr of hydrogen, the shape and surface morphology of the cylindrical hole 12 changes drastically to that of the sphere-shaped empty space 13 (FIG. 1(f)). Because of the significant surface and/or volume diffusion which occurs at high annealing temperatures, the cylindrical hole 12 is unstable beyond a critical length Lc and transforms, therefore, to a lower energy state consisting of one or more empty spheres formed along the original cylinder axis.

As analyzed by Nichols et al., in Surface-(Interface-) and Volume-Diffusion Contributions to Morphological Changes Driven by Capillarity, Trans. AIME 233 at 1840 (Oct. 1965), the disclosure of which is incorporated by reference herein, when Lc corresponds to the surface diffusion state, the number N of empty spheres that form from a cylindrical hole depends both on the length L of the cylindrical hole and on the cylinder radius Rc. Accordingly, the number N of empty spheres formed from a cylindrical hole made in a silicon substrate could be estimated according to the following equation:

$$8.89Rc\ N < L < 8.89Rc(N+1) \qquad (1)$$

wherein: N=number of empty spheres;
Rc=cylinder radius; and
L=length of cylindrical hole.

Thus, equation (1) predicts that, if L<8.89Rc, the number of empty spheres will be N=0, which means that no empty spheres will form from a cylindrical hole.

When one or more empty spheres form with a radius Rs, then according to Nichols et al., the value of Rs is given by the following equation:

$$Rs = 1.88Rc \qquad (2)$$

wherein: Rs=sphere radius; and
Rc=cylinder radius

When two or more empty spheres form from a cylinder hole with a cylinder radius Rc, then the distance $\lambda$ between the centers of two adjacent empty-spaced spheres is calculated from the following formula:

$$\lambda = 8.89Rc \qquad (3)$$

wherein: $\lambda$=center-to-center distance between two adjacent spheres; and
Rc=cylinder radius Reference is now made to FIGS. 2(a)–9(c), which exemplify the formation of a single pipe-shaped empty space 23 from a linear array of cylindrical holes 22. Similarly, FIGS. 3(a)–9(b) illustrate the formation of a single plate-shaped empty space 33 from a two-dimensional array of cylindrical holes 32 formed within a silicon substrate such as the silicon substrate 10. The values of the pipe radius Rp (of the pipe-shaped empty space 23) and that of the plate thickness Tp (of the plate-shaped empty space 33) may be calculated in a manner similar to that described above with reference to the formation of the empty sphere 13 and the calculation of sphere radius Rs in equation (2). The distance $\Delta$ between the centers of any two adjacent cylindrical holes 22, 32, in a linear array, may be calculated from the following formula:

$$2Rc < \Delta < 3.76Rc \qquad (4)$$

wherein: Rc=cylinder radius; and
$\Delta$=center-to-center distance between two adjacent cylinder holes in a linear array Equation (4) ensures that adjacent cylindrical holes 22, 32 do not touch each other allowing, therefore, the formation of a plurality of adjacent spheres that combine to form the resulting pipe-shaped empty space 23 and plate-shaped empty space 33.

The values of the pipe radius Rp and of the plate thickness Tp are given by the following two expressions:

$$Rp = (8.86 Rc^3/\Delta)^{1/2} \quad (5)$$

$$Tp = 27.83 Rc^3/\Delta^2 \quad (6)$$

wherein: Rp=pipe radius;

Tp=plate thickness; and

Δ=center-to-center distance between two adjacent cylinder holes in a linear array.

Figure 2A:
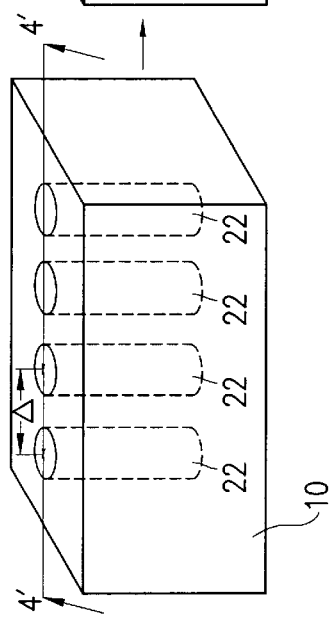
Figure 4:
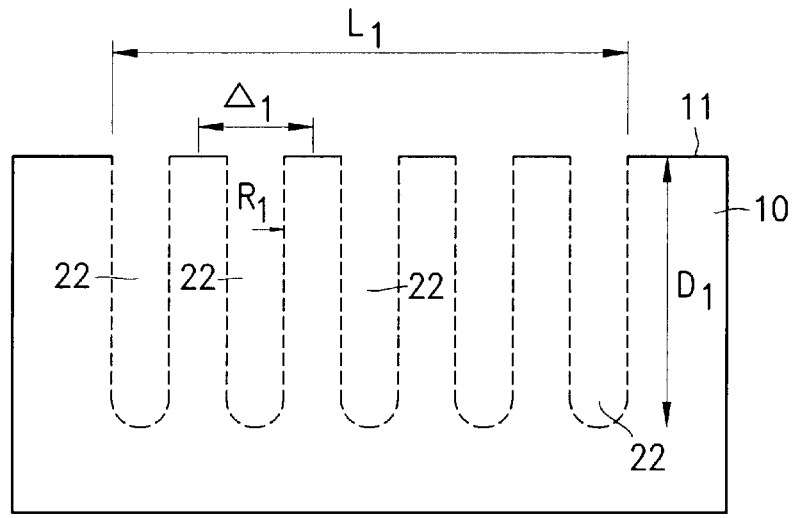

Reference is now made to FIG. 4 which, for simplicity, illustrates a cross-sectional view of structure of FIG. 2(a) on which a plurality of linear cylindrical holes 22 are drilled into silicon substrate 10 from an upper surface 11 of the substrate 10 to a depth D1. The silicon substrate 10 is annealed at a temperature of about 1100° C. and under a reducing ambient of about 10 Torr of hydrogen so that within about 60 seconds a pipe-shaped empty space 23 is formed within the silicon substrate 10 as shown in FIG. 5.

Radius R1 (FIG. 4) of each of the cylindrical holes 22 and distance Δ1 (FIG. 4) between the center of two adjacent cylindrical holes 22 may be calculated in accordance with equation (4). It must be understood that the length L1 (FIG. 4) of the array of the cylindrical holes 22 determines the length L1 (FIG. 5) of the pipe-shaped empty space 23, wherein the depth D1 (FIG. 4) to which the array of cylindrical holes 22 is drilled determines the depth D1 (FIG. 5) at which the pipe-shaped empty space 23 is formed. Both parameters define a location where a first level conductor 70 (FIGS. 13–14), will be formed as described in more detail below. Finally, the radius Rp of the pipe-shaped empty space 23 (FIG. 5) may be calculated in accordance with equation (5).

Figure 5:
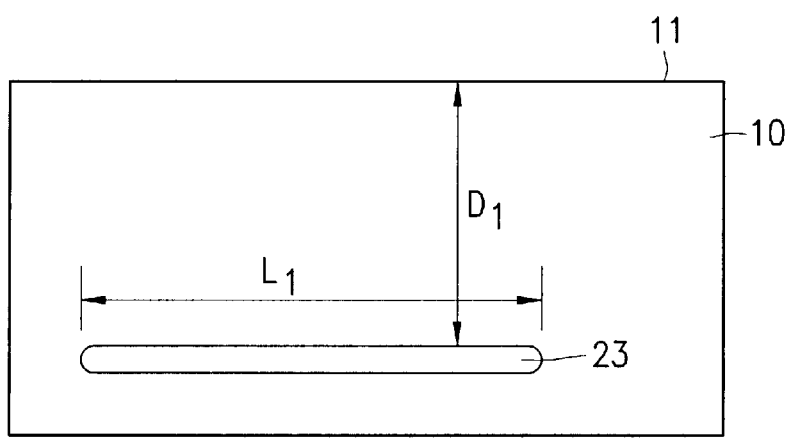
Figure 6:
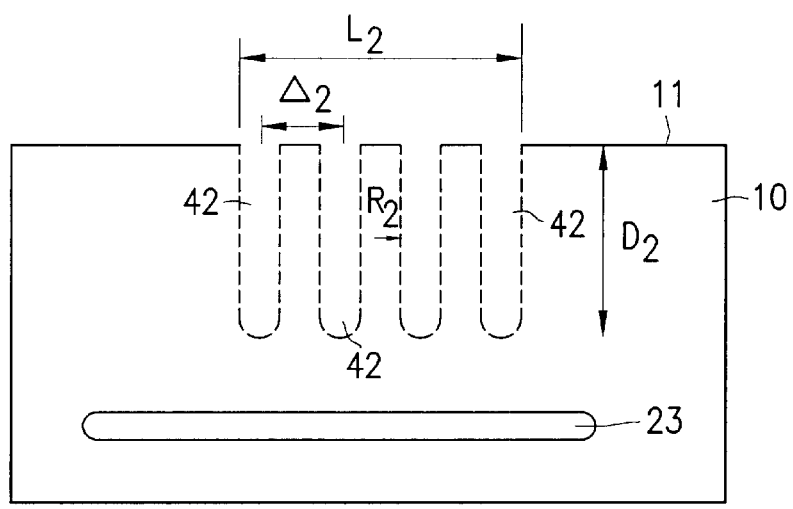

Subsequent to the formation of the pipe-shaped empty space 23, a second pipe-shaped empty space 43 (FIG. 7) may be formed above the pipe-shaped empty space 23 and below the silicon surface 11 by a technique similar to that described for the formation of the pipe-shaped empty space 23 (FIG. 5). As such, a second linear array of cylindrical holes 42 (FIG. 6) are drilled into the silicon substrate 10 to a depth D2 to define the intended location, length and orientation of a second level conductor 80 (FIGS. 13–14), the formation of which will be described in more detail below. The silicon substrate 10 is then annealed at a temperature of about 1100° C. and under a reducing ambient of about 10 Torr of hydrogen, so that within about 60 seconds the second linear array of cylindrical holes 42 transforms into the second pipe-shaped empty space 43 (FIG. 7) by steps similar to those described above with reference to FIGS. 2(a)–9(c).

Radius R2 (FIG. 6) as well as distance Δ2 (FIG. 6) between the center of two adjacent cylindrical holes 42 of the second linear array may be calculated in accordance to equation (4). Further, the length L2 (FIG. 6) of the second linear array of cylindrical holes determines the length L2 (FIG. 7) of the second pipe-shaped empty space 43, wherein the depth D2 (FIG. 6) to which the second linear array of cylindrical holes is drilled determines the depth D2 (FIG. 7) at which the second pipe-shaped empty space 43 is formed within the silicon substrate 10.

Figure 7:
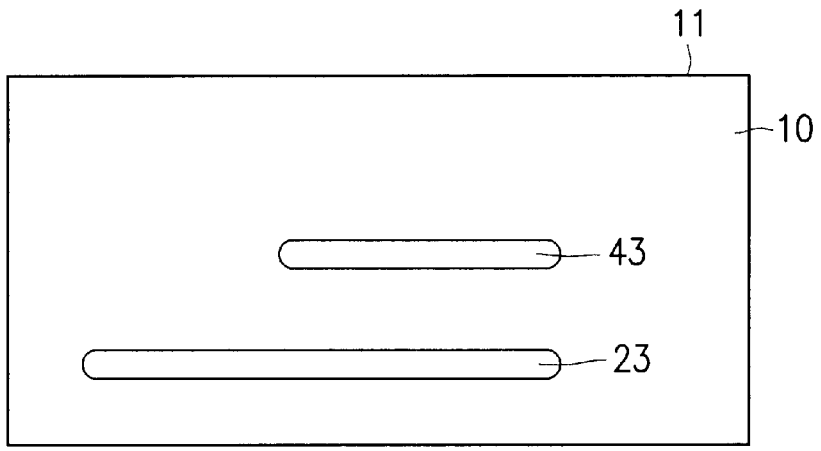
Figure 8:
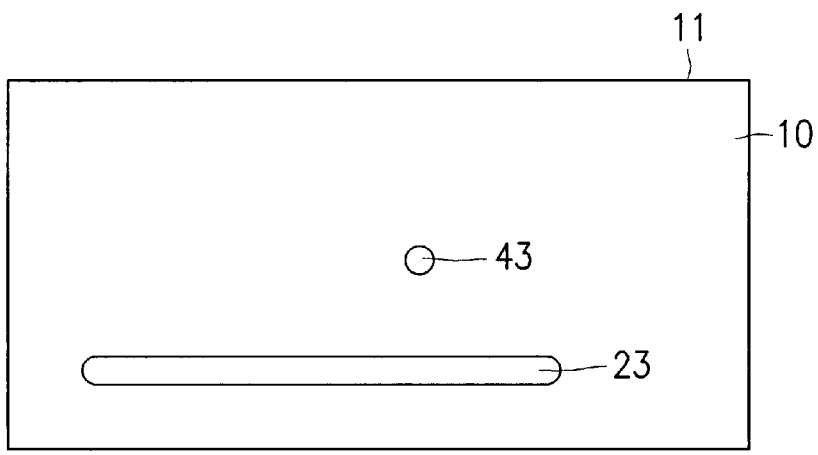

Although FIG. 7 illustrates the second pipe-shaped empty space 43 as being parallel to the pipe-shaped empty space 23, it must be understood that the second pipe-shaped empty space 43 need not be parallel to the pipe-shaped empty space 23 but may form various angles and may be placed in various directions with respect to the pipe-shaped empty space 23, according to the characteristics of the IC device to be formed. For example, FIG. 8 illustrates the second pipe-shaped empty space 43 forming a 90 degree angle with the pipe-shaped empty space 23.

Figure 9:
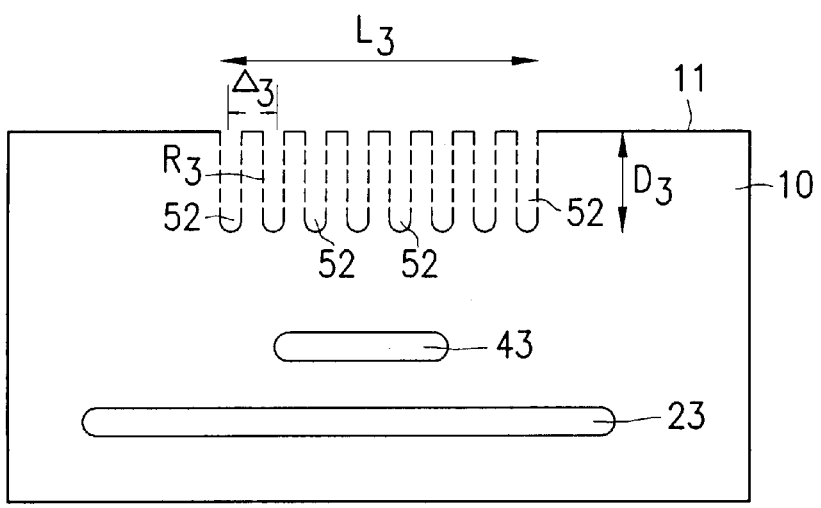
Figure 10:
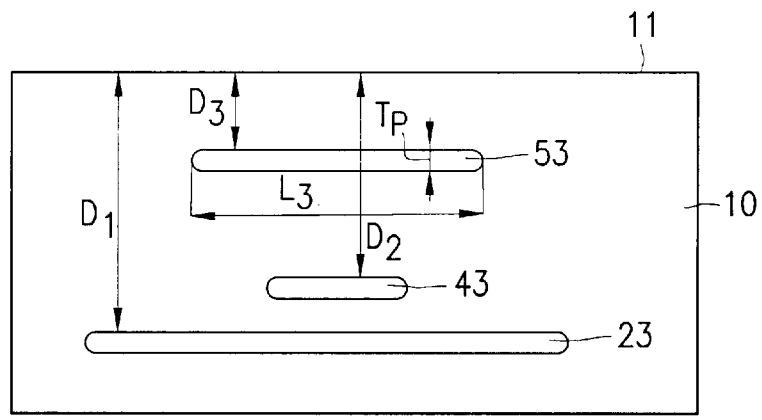
FIG. 10 is a cross-sectional view of the representative silicon structure according to the present invention at a stage of processing subsequent to that shown in FIG. 9.

FIG. 9 illustrates the formation of a two-dimensional array of cylindrical holes 52 located in between the upper silicon surface 11 and the second pipe-shaped empty space 43 which will form a plate-shaped empty space 53 (FIG. 10). Again, the silicon substrate 10 is annealed at a temperature of about 1100° C. and under a reducing ambient of about 10 Torr of hydrogen, so that within about 60 seconds the two-dimensional array of cylindrical holes 52 transforms into the plate-shaped empty space 53 (FIG. 10) by steps similar to those described above with reference to FIGS. 3(a)–9(b). For a better understanding of the invention, the structures of FIG. 10 are illustrated in a three-dimensional view in FIG. 11.

Radius R3 (FIG. 9) as well as distance Δ3 (FIG. 9) between the center of two adjacent cylindrical holes 52 of the two-dimensional array may be calculated in accordance to equation (4). Further, the length L3 (FIG. 9) of the two-dimensional array of cylindrical holes determines the length L3 (FIGS. 10–11) of the plate-shaped empty space 53, wherein the depth D3 (FIG. 9) to which the two-dimensional array of cylindrical holes is drilled determines the depth D3 (FIGS. 10–11) at which the plate-shaped empty space 53 is formed within the silicon substrate 10. Finally, the thickness Tp (FIGS. 10–11) of the plate-shaped empty space 53 may be calculated in accordance with equation (6). This plate-shaped empty region may be left empty in some areas, so that the region above the plate becomes a silicon-over-nothing area where various IC devices can then be formed. Alternatively, the plate-shaped empty region may be also filled with a conductor, as it will be described in more detail below, to provide a plate-shaped conductor region.

Figure 12:
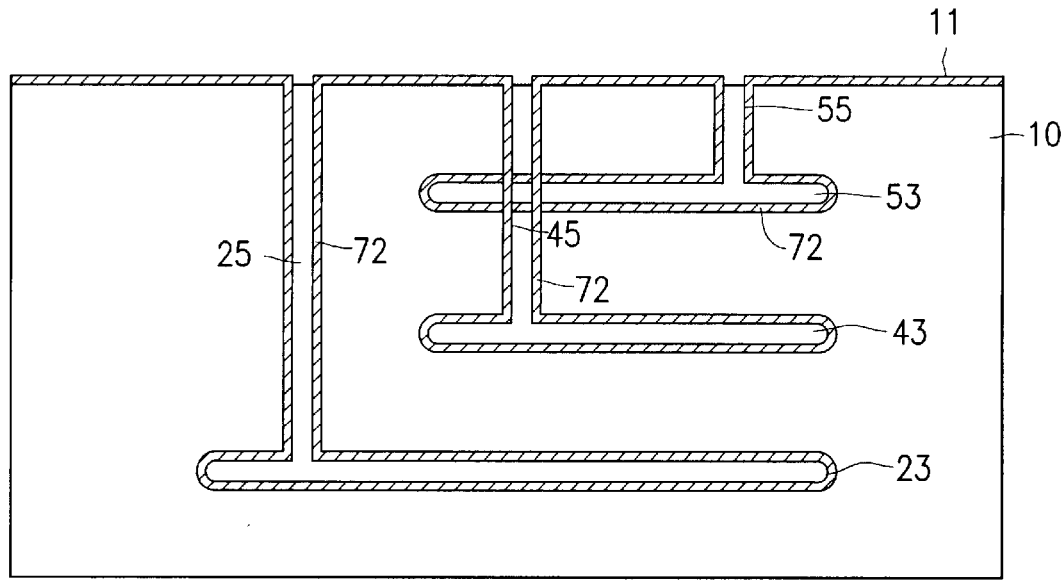
FIG. 12 is a cross-sectional view of the representative silicon structure according to the present invention at a stage of processing subsequent to that shown in FIG. 10.

Subsequent to the formation of the first pipe-shaped empty space 23, second pipe-shaped empty space 43, and plate-shaped empty space 53, additional interconnect structures and associated dielectric layers could be formed to create operative electrical paths down from the empty-spaced structures formed within the silicon substrate 10 and up to the silicon surfaces, such as the upper silicon surface 11, and any IC devices formed thereon. Accordingly, as illustrated in FIG. 12, a plurality of interconnect holes 25, 45, 55 are drilled within the silicon substrate 10 to connect each of the first pipe-shaped empty space 23, the second pipe-shaped empty space 43, and the plate-shaped empty space 53 with the upper silicon surface 11. The structure of FIG. 12 is then subjected to a conventional oxidizing atmosphere, for example an ozone oxidizing atmosphere or water vapor is heated and passed over the substrate at about 600–700° C., so that the inner surfaces of the above-described patterns, as well as the interconnect holes 24, 45, 55, are oxidized to prevent any leakage between conductors formed in areas 23, 43, 53, the substrate and any active devices that will be eventually fabricated over the silicon substrate 10.

Alternatively, or in addition to the oxidizing atmosphere, a barrier layer 72 may be formed on surfaces of the silicon substrate 10, within each of the interconnect holes 24, 45, 55, and on the inner surfaces of each of the first pipe-shaped empty space 23, the second pipe-shaped empty space 43, and the plate-shaped empty space 53, as also shown in FIG. 12. The barrier layer 72 may be formed by CVD, PVD, sputtering or evaporation, to a thickness of about 50 Angstroms to about 100 Angstroms.

Preferred materials for the barrier layer 72 are metals, such as titanium (Ti), zirconium (Zr), tungsten (W), or hafnium (Hf), or metal compounds, such as tantalum nitride (TaN) or silicon nitride ($Si_3N_4$). If desired, the barrier layer 72 may be formed of refractory metal compounds, such as refractory metal nitrides (for example TiN and HfN), refractory metal carbides (for example TiC or WC), or refractory metal borides (for example TiB or MoB). The selection of a material for the barrier layer 72 depends upon the specific conductor to be deposited and the method which is chosen to deposit such conductor. In turn, the selection of the conductor material will depend upon the type and temperature of subsequent processing steps. For example, aluminum (Al) would not be chosen as the conductor material if the subsequent processing steps require temperatures above approximately 600° C. Similarly, tungsten (W) would be a preferred conductor for temperatures above approximately 1,000° C. In any event, the barrier layer 72 suppresses the diffusion of the metal atoms from the subsequently deposited conductive material (FIG. 13), while offering a low resistivity and low contact resistance between the subsequently deposited conductive material (FIG. 13) and the barrier layer 72.

Although in an exemplary embodiment of the invention the barrier layer 72 is simultaneously deposited in the interconnect holes 24, 45, 55, and on the inner surfaces of each of the first pipe-shaped empty space 23, the second pipe-shaped empty space 43, and the plate-shaped empty space 53, the invention is not limited to this embodiment. For example, the barrier layer 72 may be deposited first in the interconnect hole 24 and its corresponding pipe-shaped empty space 23, before the formation of the interconnect hole 45 and its corresponding second pipe-shaped empty space 43, and before the formation of the interconnect hole 55 and its corresponding plate-shaped empty space 53. In this embodiment, the barrier layer 72 may be formed of a first barrier material corresponding to the pipe-shaped empty space 23, of a second barrier material corresponding to the second pipe-shaped empty space 43, and of a third barrier material corresponding to the plate-shaped empty space 53. The first, second and third barrier materials may be the same or different, depending on the characteristics of the IC device.

Figure 13:
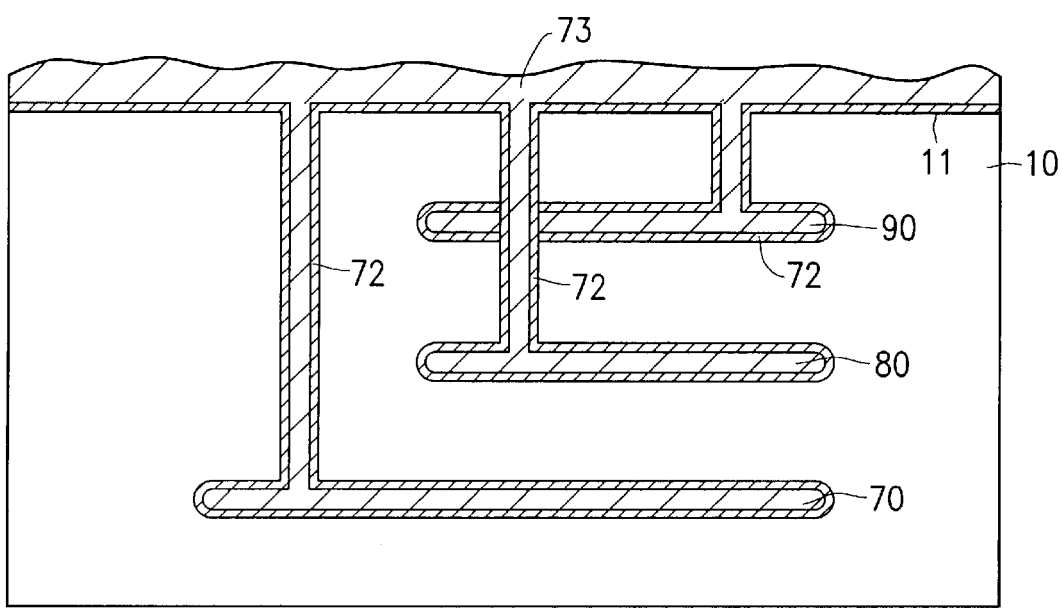
FIG. 13 is a cross-sectional view of the representative silicon structure according to the present invention at a stage of processing subsequent to that shown in FIG. 12.

As illustrated in FIG. 13, a conductive material 73 is next deposited to fill in the interconnect holes 24, 45, 55, as well as the first pipe-shaped empty space 23, the second pipe-shaped empty space 43, and the plate-shaped empty space 53. In a preferred embodiment of the invention, the conductive material 73 comprises either copper, silver, gold, tungsten or aluminum, but it must be understood that other conductive materials and/or their alloys may be used also. In any event, the conductive material 73 may be blanket deposited by a substitution technique, as described in U.S. Pat. Nos. 5,920,121; 6,100,176; 6,121,126, and U.S. application Ser. No. 09/069,346 filed Apr. 29, 1998 (disclosure of which is incorporated by reference). Alternatively, the conductive material 73 may be also blanket deposited by a known PVD, CVD, or a combination of these techniques to fill in all three interconnect holes 24, 45, 55 and their associated first pipe-shaped empty space 23, second pipe-shaped empty space 43, and plate-shaped empty space 53 to form a first buried conductor pattern 70, a second buried conductor pattern 80, and a third buried conductor pattern 90, all illustrated in FIG. 13. Alternatively, the conductive material 73 may be deposited by a plating technique.

Figure 14:
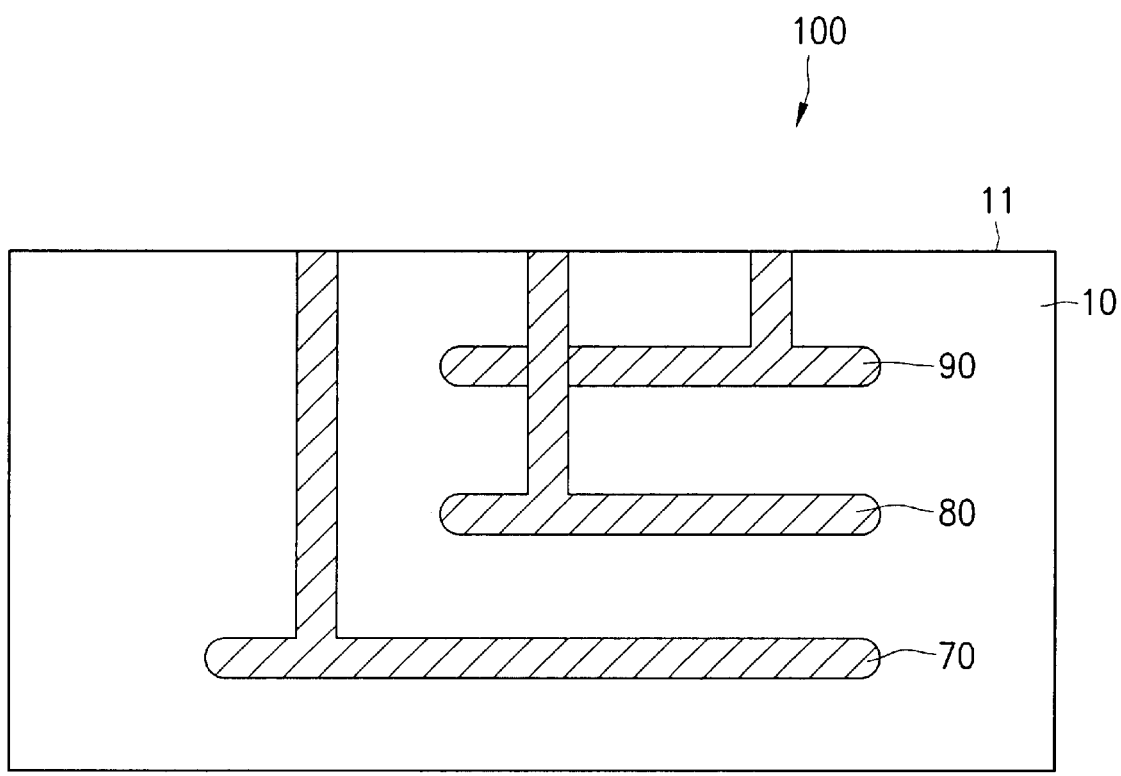
FIG. 14 is a cross-sectional view of the representative silicon structure according to the present invention at a stage of processing subsequent to that shown in FIG. 13.

After the deposition of the conductive material 73, excess barrier material and excess metal formed above the upper silicon surface 11 may be removed by either an etching or a polishing technique to form the buried silicon structure 100 illustrated in FIG. 14. In an exemplary embodiment of the present invention, chemical mechanical polishing (CMP) is used to polish away excess barrier and conductive materials above the upper silicon surface 11 of the silicon substrate 10.

Although the buried silicon structure 100 is shown in FIG. 14 as comprising only three buried conductor patterns 70, 80, and 90, respectively, it must be readily apparent to those skilled in the art that in fact any number of such buried conductor patterns may be formed on the substrate 10, as pipes, plates, or spheres, by methods of the present invention. Also, although the exemplary embodiments described above refer to the formation of buried conductor patterns having specific shapes, it must be understood that other shapes, configurations or geometries may be employed, depending on the characteristics of the particular IC device to be fabricated. Further, the invention is not limited to a combination of three buried conductor patterns, but any combination of any number of emptyspaced patterns filled with a conductor may be employed, as desired.

Figure 11:
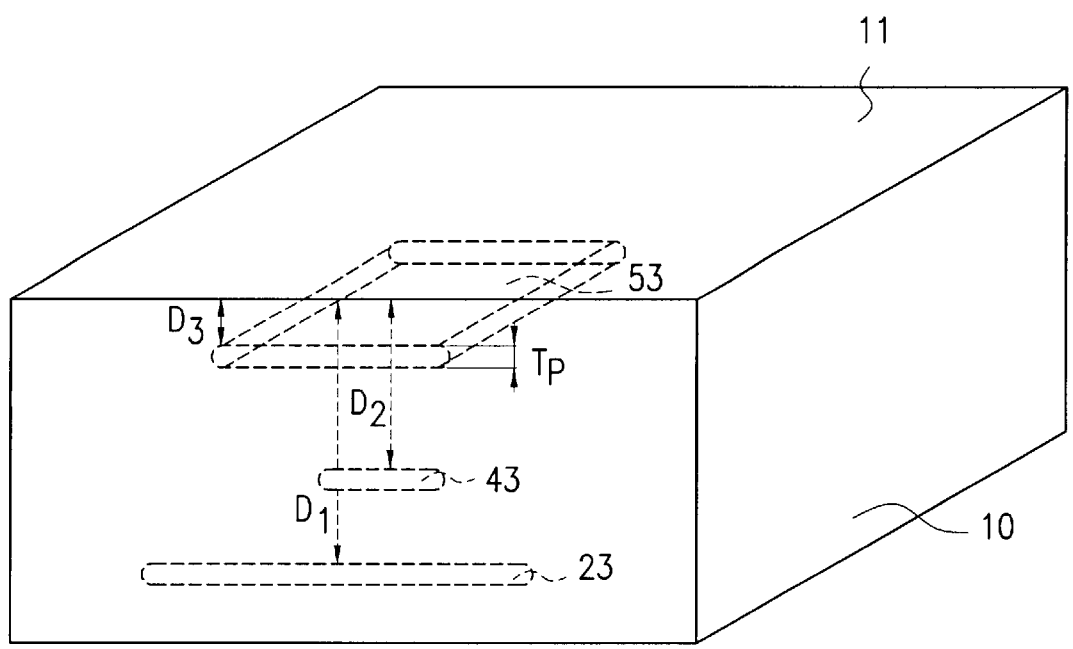
FIG. 11 is a three-dimensional view of the representative silicon structure of FIG. 10

The processing steps of the present invention may be also reduced if the lower level buried conductor patterns do not cross over each other below upper level buried patterns, such as the plate-shaped empty space 53 (FIGS. 10–12). In this case, all buried conductor patterns located below the plate-shaped empty space 53 may be simultaneously formed during the same annealing/heating cycle, to reduce therefore the number of processing steps during the fabrication of the buried silicon structure 100.

In addition, further steps to create a functional memory cell on the silicon substrate 10 may be carried out. Thus, additional multilevel interconnect layers and associated dielectric layers could be formed to create operative electrical paths from the buried silicon structure 100 to a source/drain region (not shown) adjacent to a transistor gate structure (not shown) of the substrate 10. The substrate containing the buried conductors can be used in the formation of many types of integrated circuits such as memories, for example, DRAMs, processors etc.

The invention thus provides a technique for forming buried conductors in a semiconductor, for example, silicon, substrate which may be used for example as interconnects to various structures and devices in an integrated circuit.

Figure 15:
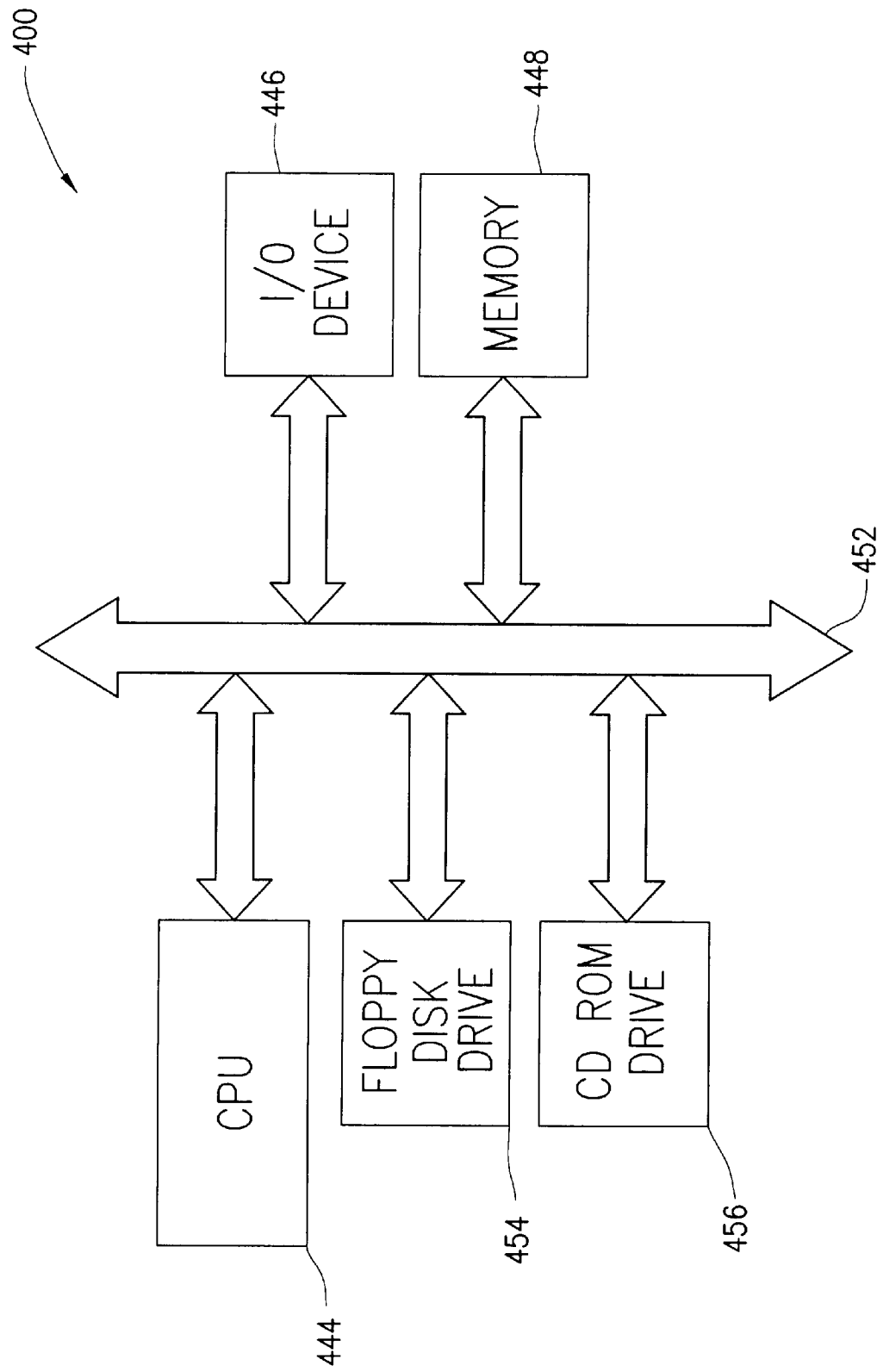
FIG. 15 is a schematic diagram of a processor system incorporating a silicon structure of the present invention.

A typical processor-based system 400 which includes a memory circuit 448, for example a DRAM, is illustrated in FIG. 15. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448, the CPU 444 or others of the illustrated electrical structures may be constructed as an integrated circuit, which includes one or more buried silicon structures 100 in accordance with the invention. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a semiconductor device, comprising the steps of:

forming at least one empty-spaced pattern beneath a surface of, and within a, semiconductor substrate) said empty-spaced pattern being surrounded by semiconductor material;

forming at least one opening within said semiconductor substrate, said opening connecting a respective empty-spaced pattern with the exterior of said semiconductor substrate; and forming a conductive material in said empty-spaced pattern and said opening.

2. The method of claim 1, wherein the act of forming said empty-spaced pattern further comprises the act of forming at least one hole within said semiconductor substrate and heat treating said substrate to form said empty-spaced pattern beneath said surface of said semiconductor material.

3. The method of claim 2, wherein said hole is a cylindrical hole.

4. The method of claim 2, wherein said semiconductor substrate is heat treated at a temperature of about 1100° C.

5. The method of claim 4, wherein said semiconductor substrate is heat treated under a hydrogen ambient.

6. The method of claim 4, wherein said semiconductor substrate is heat treated for about 60 seconds.

7. The method of claim 1, wherein said empty-spaced pattern has a pipe-shaped configuration.

8. The method of claim 1, wherein said empty-spaced pattern has a spherical configuration.

9. The method of claim 1, wherein said empty-spaced pattern has a plate-shaped configuration.

10. The method of claim 1, wherein said at least one empty-spaced pattern comprises at least one pipe-shaped pattern and at least one plate-shape pattern.

11. The method of claim 10, wherein said at least one pipe-shaped pattern and said at least one plate-shape pattern are formed simultaneously.

12. The method of claim 10, wherein said at least one pipe-shaped pattern and said at least one plate-shape pattern are formed sequentially and before said act of forming said conductive material.

13. The method of claim 1 further comprising the act of forming a barrier layer in said opening and said empty-spaced pattern before said act of forming said conductive material.

14. The method of claim 13 further comprising the act of oxidizing said opening and said empty-spaced pattern before said act of forming said barrier layer.

15. The method of claim 1 further comprising the act of oxidizing said opening and said empty-spaced pattern before said act of forming said conductive material.

16. The method of claim 1, wherein said act of forming said conductive material further comprises depositing a conductive material inside said opening and said empty-spaced pattern.

17. The method of claim 16, wherein said conductive material is formed of a material selected from the group consisting of copper, copper alloy, silver, silver alloy, gold, gold alloy, tungsten, tungsten alloy, aluminum, and aluminum alloy.

18. The method of claim 16 further comprising the step of chemical mechanical polishing said substrate to remove said conductive material on a surface thereof.

19. The method of claim 1, wherein said semiconductor substrate is a silicon substrate.

20. The method of claim 1, wherein said semiconductor substrate is a germanium substrate.

21. The method of claim 1, wherein said semiconductor substrate is a silicon-on-insulator substrate.

22. The method of claim 1, wherein said semiconductor substrate is a silicon-on-nothing substrate.

23. A method of forming at least one buried conductor pattern in a monocrystalline substrate, said method comprising the steps of:
    forming a plurality of cylindrical holes in said monocrystalline substrate;
    annealing said monocrystalline substrate to form at least one empty-spaced pattern within, and surrounded by, said monocrystalline substrate and below a surface of said monocrystalline substrate;
    forming at least one opening in said monocrystalline substrate which communicates with a respective empty-spaced pattern; and
    forming a conductive material in said empty-spaced pattern.

24. The method of claim 23, wherein said act of annealing is performed under a reducing atmosphere.

25. The method of claim 24, wherein said reducing atmosphere is a hydrogen atmosphere at a temperature lower than the melting temperature of said monocrystalline substrate.

26. The method of claim 25, wherein said act of annealing is performed for about 60 seconds.

27. The method of claim 23, wherein said empty-space pattern is a pipe-shaped pattern.

28. The method of claim 23, wherein said empty-space pattern is a plate-shaped pattern.

29. The method of claim 23, wherein said empty-space pattern is a sphere-shaped pattern.

30. The method of claim 23, further comprising the act of forming at least two empty-spaced patterns.

31. The method of claim 30, wherein said at least two empty-spaced patterns are simultaneously formed.

32. The method of claim 30, wherein one of said empty-spaced patterns is located below said other empty-spaced pattern relative to said surface of said monocrystalline substrate.

33. The method of claim 23 further comprising the act of forming a barrier layer in said opening and said empty-spaced pattern before said act of forming said conductive material.

34. The method of claim 33 further comprising the act of oxidizing said opening and said empty-spaced pattern before said act of forming said barrier layer.

35. The method of claim 23 further comprising the act of oxidizing said opening and said empty-spaced pattern before said act of forming said conductive material.

36. The method of claim 23, wherein said act of forming said conductive material further comprises depositing a conductive material inside said empty-spaced pattern through said opening.

37. The method of claim 36, wherein said conductive material is formed of a material selected from the group consisting of copper, copper alloy, silver, silver alloy, gold, gold alloy, tungsten, tungsten alloy, aluminum, and aluminum alloy.

38. The method of claim 36 further comprising the step of chemical mechanical polishing said substrate to remove said conductive material on a surface thereof.

39. The method of claim 23, wherein said act of forming said conductive material further comprises forming said conductive material in said opening.

40. The method of claim 23 further comprising the act of forming a second conductive material in said opening, said second conductive material being different than said conductive material in said empty-spaced pattern.

41. The method of claim 40, wherein second conductive material is formed of a material selected from the group consisting of copper, copper alloy, silver, silver alloy, gold, gold alloy, tungsten, tungsten alloy, aluminum, and aluminum alloy.

42. The method of claim 23, wherein said monocrystalline substrate is a silicon substrate.

43. The method of claim 23, wherein said monocrystalline substrate is a germanium substrate.

44. The method of claim 23, wherein said monocrystalline substrate is a silicon-on-insulator substrate.

45. The method of claim 23, wherein said monocrystalline substrate is a silicon-on-nothing substrate.

* * * * *

UNITED STATES PATENT AND TRADEMARK OFFICE
CERTIFICATE OF CORRECTION

PATENT NO.    : 6,383,924 B1
DATED         : May 7, 2002
INVENTOR(S)   : Paul A. Farrar et al.

It is certified that error appears in the above-identified patent and that said Letters Patent is hereby corrected as shown below:

Column 2,
Line 19, replace "1(a)–9(f)" with -- 1(a)–(f) --.
Line 22, replace "1(a)–9(f)" with -- 1(a)–(f) --.
Line 26, replace "1(a)–9(f)" with -- 1(a)–(f) --.

Column 3,
Line 55, replace "1(a)–9(f)" with -- 1(a)–(f) --.

Column 4,
Line 43, replace "2(a)–9(c)" with -- 2(a)–(c) --.
Line 46, replace "3(a)–9(b)" with -- 3(a)–(b) --.

Column 5,
Line 48, replace "2(a)–9(c)" with -- 2(a)–(c) --.

Column 6,
Line 10, replace "3(a)–9(b)" with -- 3(a)–(b) --.

Column 8,
Line 7, replace "emptyspaced" with -- empty-spaced --.
Line 61, replace "substrate)" with -- substrate, --.

Signed and Sealed this

Nineteenth Day of November, 2002

*Attest:*

JAMES E. ROGAN
*Attesting Officer*            *Director of the United States Patent and Trademark Office*